(12) United States Patent
Onishi

(10) Patent No.: US 7,849,588 B2
(45) Date of Patent: Dec. 14, 2010

(54) ELECTRONIC COMPONENT MOUNTING APPARATUS WITH SETTING DEVICE SETTING MEASUREMENT POSITIONS FOR PRINTED BOARD

(75) Inventor: Seiji Onishi, Gunma (JP)

(73) Assignee: Hitachi High-Tech Instruments Co., Ltd., Saitama (JP)

( * ) Notice: Subject to any disclaimer, the term of this patent is extended or adjusted under 35 U.S.C. 154(b) by 188 days.

(21) Appl. No.: 12/109,748

(22) Filed: Apr. 25, 2008

(65) Prior Publication Data
US 2008/0263858 A1    Oct. 30, 2008

(30) Foreign Application Priority Data
Apr. 26, 2007    (JP) .............................. 2007-117762

(51) Int. Cl.
    *B23P 19/00*    (2006.01)
(52) U.S. Cl. .............................. 29/743; 29/712; 29/833; 414/737
(58) Field of Classification Search .................... 29/705, 29/719–722, 739–743, 832–834; 414/737, 414/752.2; 901/40; 174/255–262; 700/121, 700/125
    See application file for complete search history.

(56) References Cited

U.S. PATENT DOCUMENTS 5,749,142 A * 5/1998 Hanamura .................... 29/833
6,356,352 B1 * 3/2002 Sumi et al. ................... 356/614
6,530,517 B1 * 3/2003 Kou ............................ 235/375
7,032,298 B2 * 4/2006 Sin .............................. 29/739
7,200,925 B2 * 4/2007 Hata et al. ..................... 29/832
7,587,814 B2 * 9/2009 Suhara ......................... 29/740

FOREIGN PATENT DOCUMENTS

JP        2006-286707        10/2006

* cited by examiner

*Primary Examiner*—Minh Trinh
(74) *Attorney, Agent, or Firm*—Morrison & Foerster LLP

(57) ABSTRACT

An electronic component mounting apparatus includes a component feeding device that supplies an electronic component to a pickup position, a suction nozzle that picks up the electronic component supplied to the pickup position and mounts the picked up electronic component on a printed board, a height level detection device that measures height levels of the printed board positioned in a mounting position, a monitor graphically that displays a warping state of a sample printed board positioned in the mounting position based on height level measurements by the height level detection device on predetermined positions of the sample printed board, a setting device that sets measurement positions for actual mounting operations using the monitor, a converting device that converts the set measurement positions into coordinates on the printed board, and a memory that stores the converted coordinates of the set measurement position.

2 Claims, 6 Drawing Sheets

| | |
|---|---|
| A | 0.550 −0.600 |
| B | 0.500 −0.550 |
| C | 0.450 −0.500 |
| D | 0.400 −0.450 |
| E | 0.350 −0.400 |
| F | 0.300 −0.350 |
| G | 0.250 −0.300 |
| H | 0.200 −0.250 |
| I | 0.150 −0.200 |

FIG.8

| Step number | X coordinate | Y coordinate | Angle | Command | Alignment number |
|---|---|---|---|---|---|
| 0001 | XX1 | YY1 | — | w | — |
| 0002 | XX2 | YY2 | — | w | — |
| 0003 | XX3 | YY3 | — | w | — |
| . | . | . | . | . | — |
| . | . | . | — | . | — |
| . | X1 | Y1 | θ1 | o | 701 |
| . | X2 | Y2 | θ2 | o | 703 |
| . | X3 | Y3 | θ3 | o | 702 |
| . | . | . | . | . | . |
| . | . | . | . | . | . |
| . | . | . | . | . | . |

ELECTRONIC COMPONENT MOUNTING APPARATUS WITH SETTING DEVICE SETTING MEASUREMENT POSITIONS FOR PRINTED BOARD

CROSS-REFERENCE OF THE INVENTION

This application claims priority from Japanese Patent Application No. 2007-117762, the content of which is incorporated herein by reference in its entirety.

BACKGROUND OF THE INVENTION

1. Field of the Invention

The invention relates to an electronic component mounting apparatus for picking up electronic components from a component feeding device by suction by suction nozzles and mounting the electronic components on a positioned printed board. In detail, the invention relates to a method of mounting an electronic component and an electronic component mounting apparatus in which electronic components are picked up from a component feeding device by suction by suction nozzles, a height level of a positioned printed board is measured by a height level detection device, and the electronic components are mounted on the printed board based on the measurement result of this height level detection device.

2. Description of the Related Art

A general electronic component mounting apparatus is disclosed in Japanese Patent Application publication No. 2006-286707 and so on, for example. In some cases, due to a warp of a printed board, electronic micro-components may be brought back instead of mounted, crack, or scatter solders in the mounting operation. Therefore, the lowering of suction nozzles during the mounting of electronic components is controlled, using a device for detecting a height level of a board such as a laser displacement gauge and based on its measurement result.

However, a plurality of positions for height measurement need be set on a printed board, taking account of the warping state or curvature of the board, and inputting the coordinates of the measurement positions is a complicated work. The invention realizes setting of measurement positions suitable for a warping state of a printed board and an easy work of setting the measurement positions.

SUMMARY OF THE INVENTION

The invention provides a method of mounting an electronic component in which an electronic component is picked up from a component feeding device by suction by a suction nozzle, a height level of a positioned printed board is measured by a height level detection device, and the electronic component is mounted on the printed board based on the measurement result of the height level detection device, the method including: measuring a warping state of a positioned printed board as a measurement sample by the height level detection device; displaying the warping state of the printed board graphically on a monitor based on the measurement result; setting a measurement position on the displayed graphic; and converting the set measurement position into coordinates on the printed board and storing the coordinates in a memory.

The invention also provides an electronic component mounting apparatus in which an electronic component is picked up from a component feeding device by suction by a suction nozzle, a height level of a positioned printed board is measured by a height level detection device, and the electronic component is mounted on the printed board based on the measurement result of the height level detection device, including: a monitor graphically displaying a warping state of a positioned printed board as a measurement sample based on a result of measuring the warping state of the printed board by the height level detection device; a setting device setting a measurement position on the displayed graphic; a converting device converting the measurement position set by the setting device into coordinates on the printed board; and a memory storing the converted coordinates of the set position.

BRIEF DESCRIPTION OF THE DRAWINGS

FIG. 8 is a table showing mounting data.

DETAILED DESCRIPTION OF THE INVENTION

Figure 1:
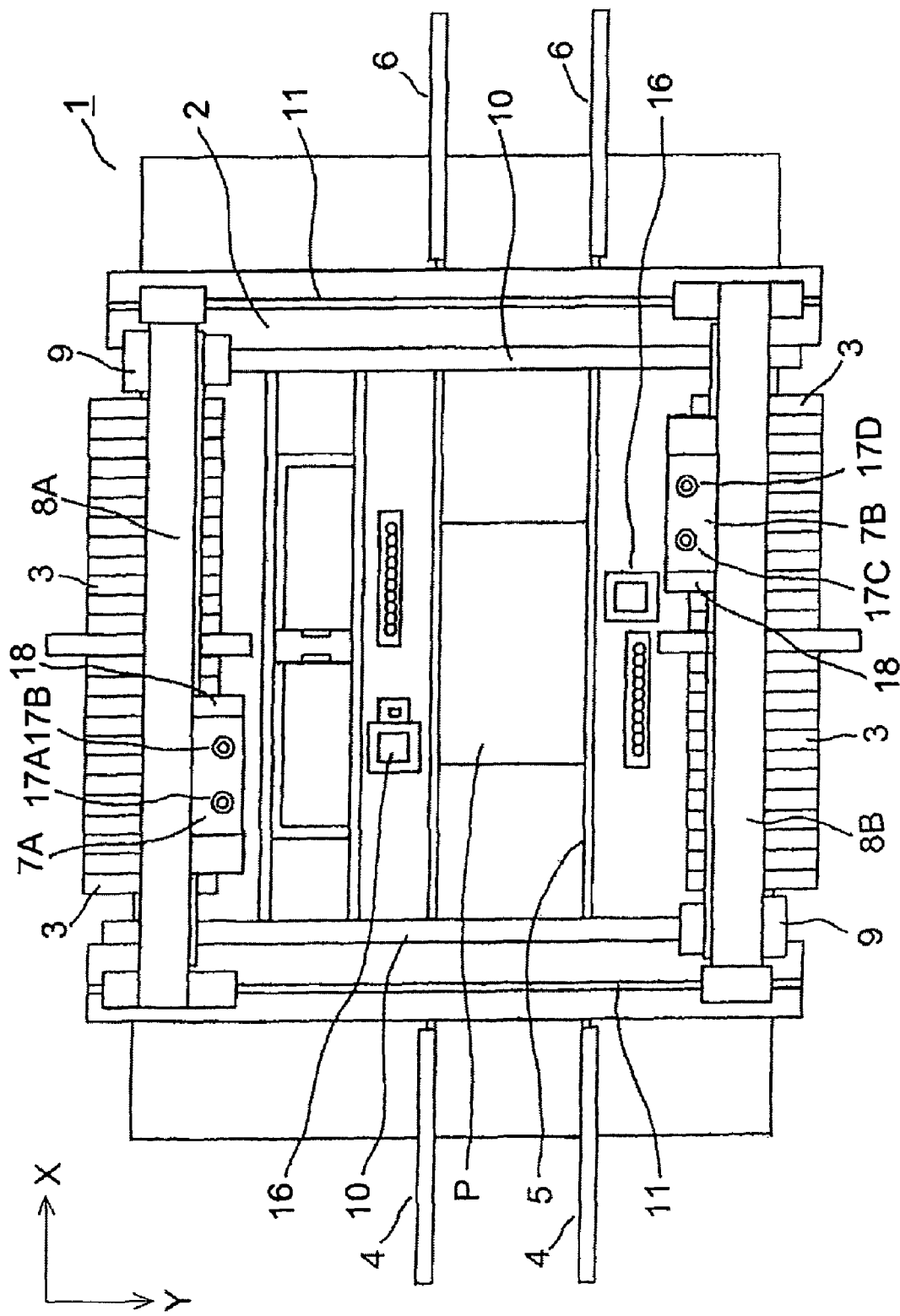
FIG. 1 is a plan view of an electronic component automatic mounting apparatus.

An embodiment of an electronic component mounting apparatus for mounting electronic components on a printed board will be described referring to figures. FIG. 1 is a plan view of an electronic component mounting apparatus 1, and a plurality of component feeding units 3 supplying various electronic components to these component pickup portions (component suction positions) one by one is arrayed on a base 2 of the apparatus 1. A supplying conveyer 4, a positioning portion 5 and a discharging conveyer 6 are provided between the opposite groups of component feeding units 3. The supplying conveyer 4 carries a printed board P received from an upstream device to the positioning portion 5, the printed board P is positioned by a positioning mechanism (not shown) on the positioning portion 5, electronic components are mounted on the printed board P, and the printed board P is carried to the discharging conveyer 6.

Numerals 8A and 8B indicate a pair of beams extending in the X direction, which separately move in the Y direction along a pair of left and right guides 11 above a printed board P or above the component pickup portions (component suction positions) of the component feeding units 3 by rotation of screw axes 10 driven by Y axis motors 9, respectively.

The beams 8A and 8B are respectively provided with mounting heads 7A and 7B moving in the longitudinal direction of the beams 8A and 8B, that is, in the X direction along guides (not shown) by X axis motors 12. Two vertical axis motors 13 vertically moving two suction nozzles 17A and 17B or two suction nozzles 17C and 17D are mounted on each of the mounting heads 7A and 7B, and two θ axis motors 14 rotating these suction nozzles about vertical axes are further mounted thereon. Therefore, the suction nozzles of each of the two mounting heads 7A and 7B are movable in the X and Y directions, rotatable about vertical axes, and movable vertically.

Numerals 16 indicate component recognition cameras, which take images of electronic components held by the suction nozzles 17A, 17B, 17C and 17D. Numerals 18 indicate height level detection devices such as laser displacement gauges provided on the mounting heads 7A and 7B respectively, which measure a height level of a printed board P positioned on the positioning portion.

Figure 2:
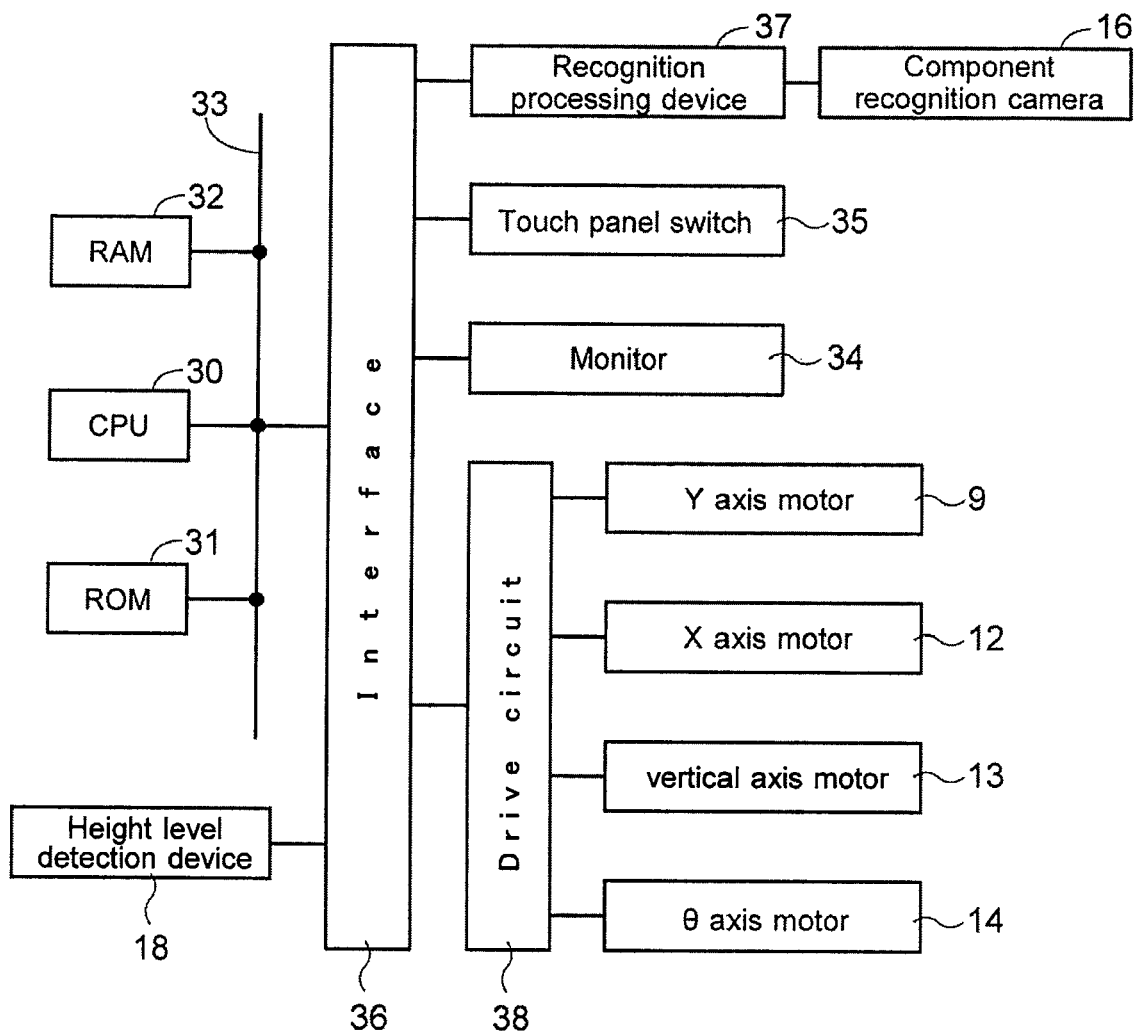
FIG. 2 is a control block diagram.

Next, referring to a control block diagram in FIG. 2, a CPU 30 controls the members of the electronic component mounting apparatus 1, and is connected to a ROM 31 storing programs for this control and a RAM 32 storing various data through bus lines 33. A monitor 34 displaying an operation screen or the like and a touch panel switch 35 as input means formed on the display screen of the monitor 34 are connected to the CPU 30 through an interface 36. The Y axis motor 9 and so on are connected to the CPU 30 through a drive circuit 38 and the interface 36. The touch panel switch 35 may be replaced by a keyboard or other input means, and operation means such as a mouse may be further connected to the CPU 30.

The RAM 32 is stored with mounting data for each of types of printed boards P for the component mounting operation, in which data about mounting coordinates of each of electronic components in the X and Y directions on the printed board P and the angle thereof, data about the alignment numbers of the component feeding units 3 or the like are stored in mounting order (in step number order). The RAM 32 is also stored with data about types of electronic components corresponding to the alignment numbers of the component feeding units 3, i.e., component disposition data, and further stored with component library data about the lengths of the electronic components in the X and Y directions and the thicknesses thereof, nozzle IDs of suction nozzles used for electronic components, or the like classified by the component IDs.

Furthermore, the RAM 32 is also stored with numerous measurement positions for measuring a warping state of a printed board P by the height level detection device 18, for example, coordinate data (measurement position data) about numerous measurement positions finely set at equal intervals over the whole regions of a printed board P.

A numeral 37 is a recognition processing device connected to the CPU 30 through the interface 36, which performs recognition processing to an image taken and stored by the component recognition camera 16 and sends the processing result to the CPU 30. In detail, the CPU 30 outputs a command to perform recognition processing (such as calculation of an positional shifting amount) to an image taken by the component recognition camera 16 to the recognition processing device 37, and receives the recognition processing result from the recognition processing device 37. However, the measurement points are not used when electronic components are mounted.

Figure 4:
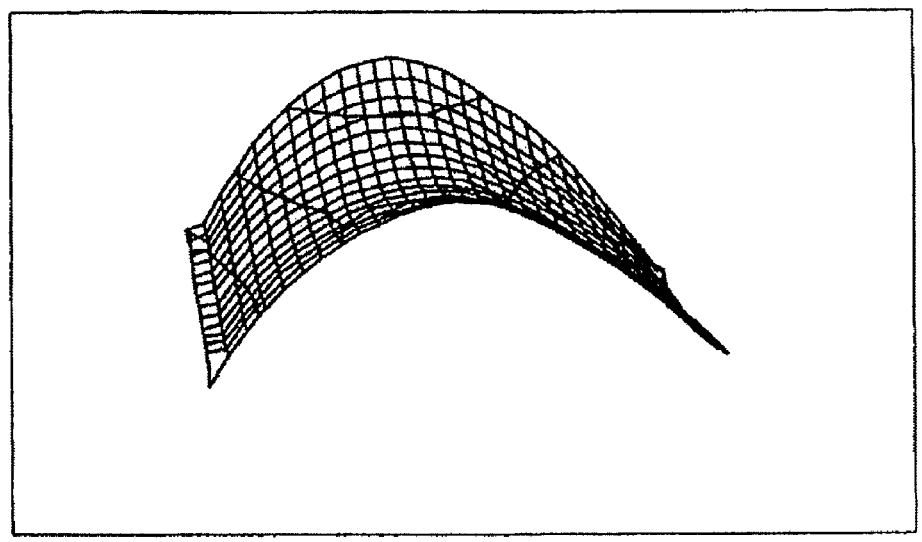
FIG. 4 is a view of a screen three-dimensionally displaying a warping state of a printed board.
Figure 5:
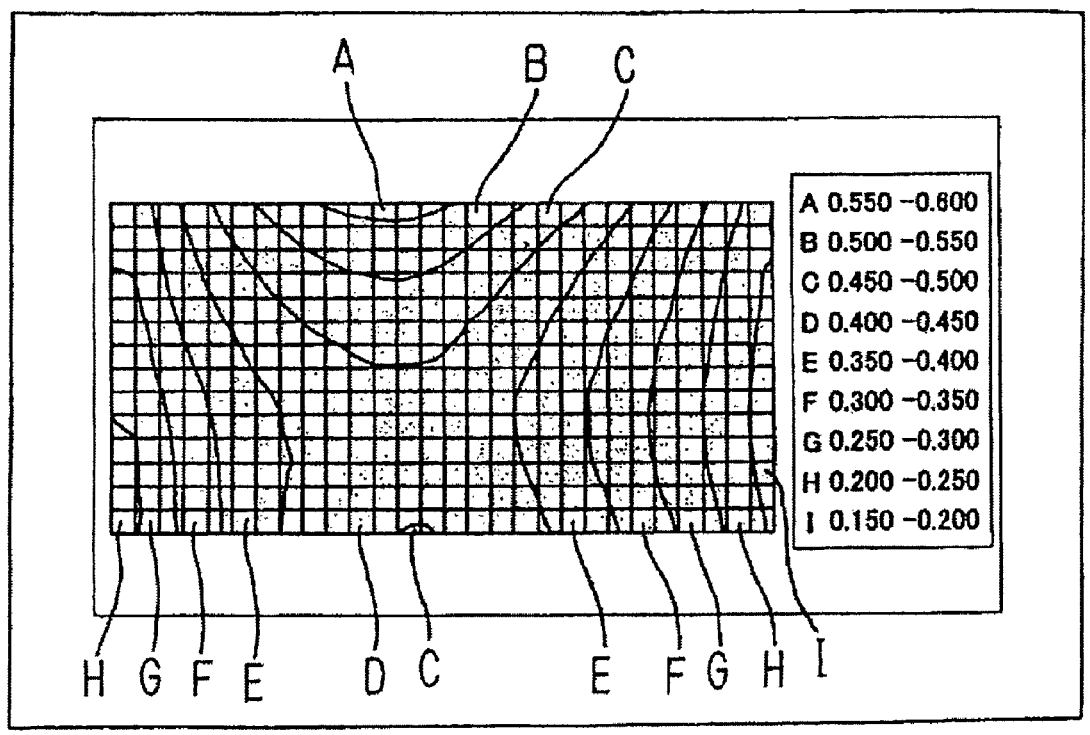
FIG. 5 is a view of a screen displaying a warping state of a printed board by contour lines.

Selection may be made whether the warping state of the printed board P is displayed three-dimensionally as shown in FIG. 4 or by contour lines as shown in FIG. 5, based on a measurement result about height levels measured by the height level detection device 18 according to the measurement position data, by touch-operating the touch panel switch 35 while watching a selection screen displayed on the monitor 34. Therefore, according to the selected display program stored in the ROM 31, the CPU 30 displays the warping state of the printed board P on the monitor 34 three-dimensionally or by contour lines.

The three-dimensional display of the printed board P may be shifted, that is, the side of the printed board P to watch may be changed by operation of an operator.

In this case, for example, the screen indicates that the A region of the printed board P is on the level higher than the reference level by 0.550 to 0.600 mm by warping upward and similarly the B region is on the level higher than the reference level by 0.500 to 0.550 mm.

The height levels may be displayed with different colors or patterns in each of the regions, or with different colors in each of the grid-partitioned regions of the substrate, for example.

Figure 3:
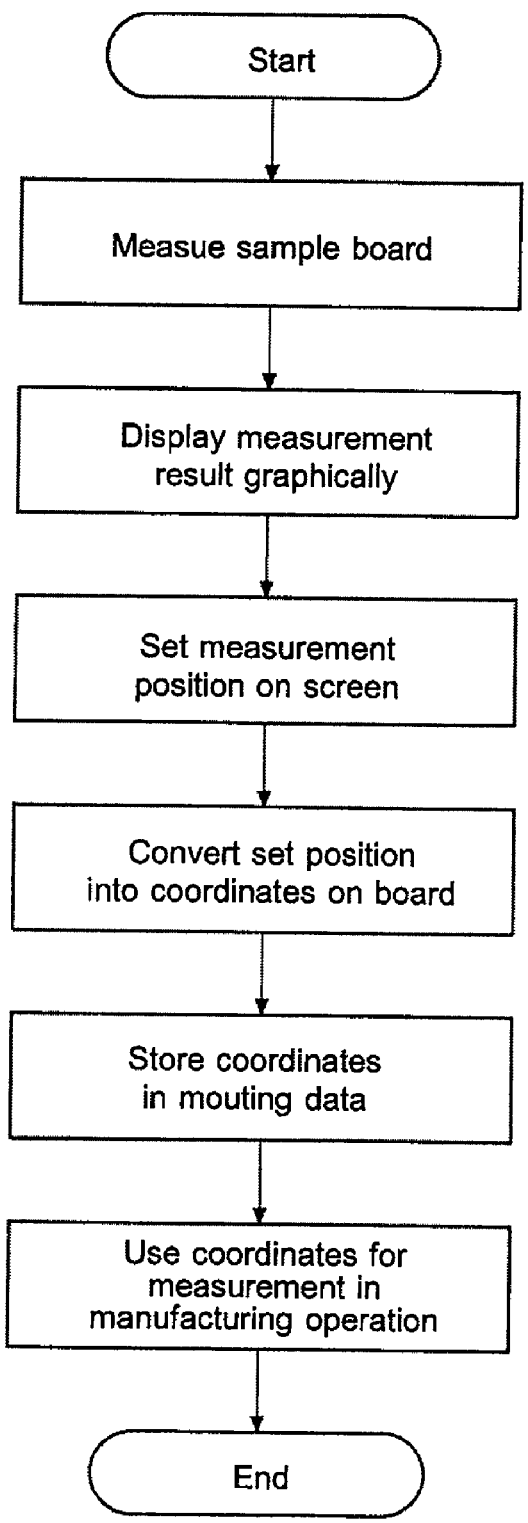
FIG. 3 is a flow chart.

Next, a description will be given referring to a flow chart in FIG. 3, hereafter. First, by an operator, a printed board P as a measurement sample is mounted on the positioning portion 5, and the positioning mechanism is activated to position the printed board P three-dimensionally in the X, Y and vertical directions by touch-operating the touch panel switch 35 displayed on the monitor 34. Then, the backup base (not shown) which has a plurality of holes where backup pins necessary for the printed board P for the manufacturing process are inserted is lifted up to apply the backup pins to the back surface of the printed board P and to push up and support the board P horizontally.

Then, the warping state of the printed board P is measured by touch-operating the touch panel switch 35. At this time, according to the touch-operation of the touch panel switch 35, the CPU 30 controls the X axis motor 12 and the Y axis motor 9 to move the height level detection device 18, controls the height level detection device 18 to measure the height levels of the printed board P in the measurement positions based on the coordinate data (measurement position data) about numerous measurement positions stored in the RAM 32, and stores the measurement result in the RAM 32.

Then, the CPU 30 graphically displays the warping state of the printed board P on the monitor 34 as shown in FIG. 4 when the three-dimensional display is selected or as shown in FIG. 5 when the contour line display is selected, based on the measurement result.

Figure 6:
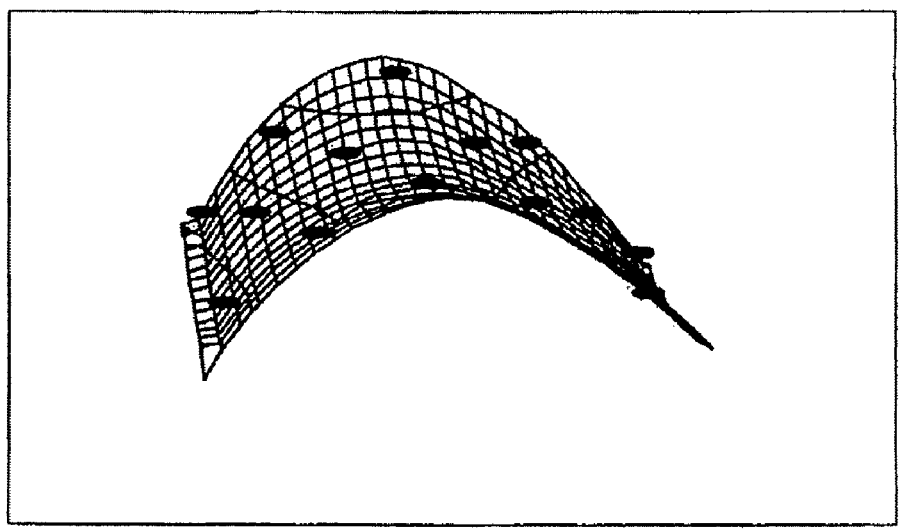
FIG. 6 is a view of a screen three-dimensionally displaying a state where measurement points are set.
Figure 7:
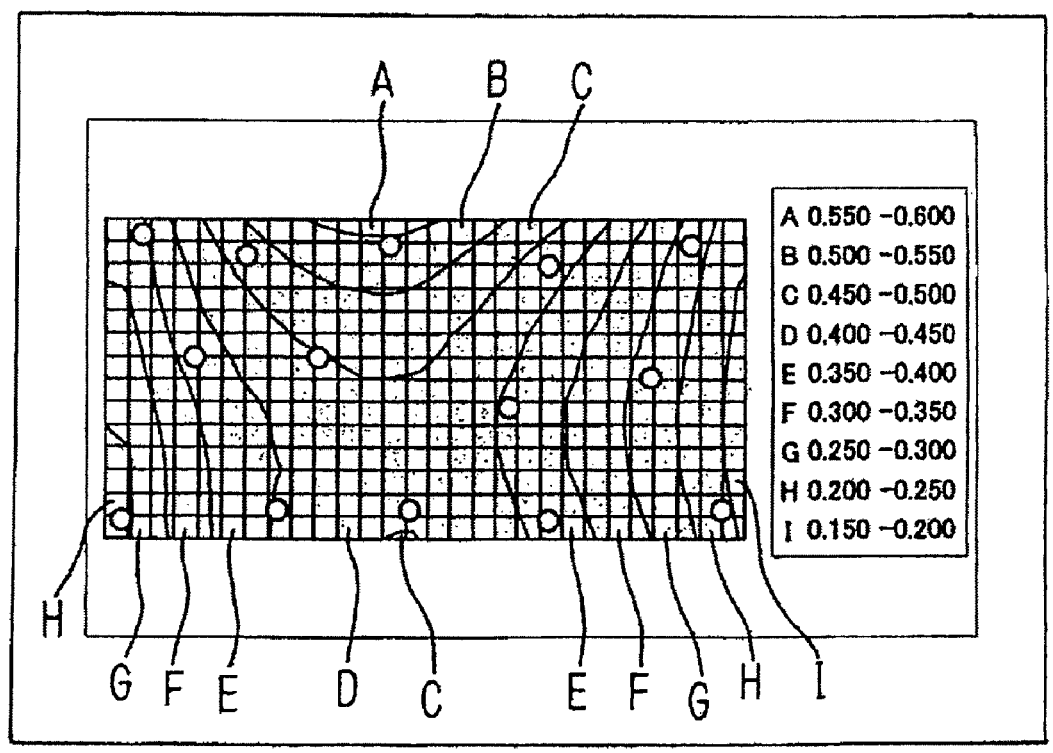
FIG. 7 is a view of a screen displaying a state where measurement points are set by contour lines.

At this time, the operator may set the measurement positions on either of the displays on the screen by touch-operation on the screen. In detail, touching the positions to be measured means operating the touch panel switch 35 on the monitor 34, and thus the operator easily sets the measurement positions while watching the warping state of the board which is graphically displayed. In this case, black portions in FIG. 6 are the set positions, and white circle portions in FIG. 7 are the set positions. The position may be set by indicating it by a cursor (not shown) and pressing an enter key, or by clicking a mouse.

One of the screens of FIG. 6 and FIG. 7 may be used to set some positions by touch-operation, and then the other screen may be selected to set other positions. At this time, the measurement positions which are already set remain displayed on the switched screen. The screen may be switched after all the measurement positions are set, and enhanced setting of measurement positions may be achieved by checking both the screens. Furthermore, the set measurement position may be canceled to omit an unnecessary measurement position. The canceling method includes clicking a mouse on the set points twice, or using a touch panel switch, for example, touching a "delete" portion displayed on the screen.

After the setting, the CPU 30 converts each of the set positions into coordinates on the printed board P, writes the coordinates of each of the set positions in the top of the mounting data as shown in FIG. 8, and stores the data in the RAM 32. For example, for the step number 0001, XX1 and YY1 are written as the X coordinate and the Y coordinate, and "W" is written as the command of the mounting data about the measurement positions, which is distinguished from the mounting data about the mounting positions of the electronic components.

Hereafter, an operation with the above structure will be described. First, a printed board P is received by the supplying conveyer 4 from an upstream device (not shown), and the printed board P on the supplying conveyer 4 is carried onto the positioning portion 5.

At this time, the printed board P is positioned three-dimensionally in the X, Y and vertical directions by the positioning mechanism, and the backup base (not shown) having the holes where the backup pins necessary for the printed board P for the manufacturing process are inserted is lifted up to apply the backup pins to the back surface of the printed board P and to push up and support the board P horizontally.

The positioning operation for the printed board P is completed in this manner. When judging the completion of the positioning operation, the CPU 30 controls the X axis motor 12 and the Y axis motor 9 to move the mounting head 7A or 7B and the detection device 18. In this case, the CPU 30 moves the height level detection device 18 to the position above the coordinates of the measurement position indicated by the step number 0001 and detects the height level of the printed board P there according to the mounting data shown in FIG. 8 stored in the RAM 32, and similarly moves the height level detection device 18 to the position above the coordinates indicated by the step number 0002 and detects the height level of the printed board P there. The CPU 30 then repeats the detection of the height levels on all the set measurement coordinates, and stores the height level data as the measurement values in the RAM 32.

At this time, the number of measurement positions is minimized and the time for detecting the height levels of the board is reduced since the measurement positions are set on the screen graphically displaying the state of the board.

Then, the suction nozzle 17A, 17B, 17C or 17D picks up an electronic component to be mounted from the predetermined component feeding unit 3, according to the mounting data stored in the RAM 32, where the position of the X and Y coordinates and the rotation angle about the vertical axis for mounting the electronic component on the printed board P positioned on the positioning portion 5, the FDR number (the alignment number of each of the component feeding units 3) and so on are set, next to the mounting data about the measurement positions.

In detail, if the suction nozzle 17A of the mounting head 7A corresponds to the type of the electronic component, the suction nozzle 17A moves to the position above the component feeding unit 3 storing the first electronic component to be mounted. In detail, as described above, the mounting head 7A is moved in the Y direction by the beam 8A moving along the pair of guides 11 by the Y axis motor 9, and is moved in the X direction by the X axis motor 12. The predetermined feeding unit 3 is already driven and the electronic component is ready to be picked up on the component pickup position. Then, the vertical axis motor 13 is driven to lower the nozzle 17A and the nozzle 17A picks up the electronic component by suction. The suction nozzle 17B then moves to the position above the component feeding unit 3 storing the next electronic component to be mounted and picks up the electronic component.

Furthermore, the suction nozzles 17A and 17B move to the position above the component recognition camera 16, and the component recognition camera 16 takes images of the electronic components held by suction, and the recognition processing device 37 performs recognition processing to the images. Based on the recognition result, the beam 8A and the mounting head 7A are moved again, and the suction nozzles 17A and 17B correct the positional shifts of the components by adding the component recognition result to the mounting coordinates in the mounting data and mount the electronic components on the printed board P respectively.

At this time, the suction nozzles 17A and 17B, which pick up electronic components by suction and mount the electronic components on a printed board P by rotating by the θ axis motors 14 and lowering by the vertical axis motors 13 respectively, use the measurement values when mounting the electronic components. In detail, based on the measurement values of the height levels of the printed board P corresponding to the component mounting positions, the CPU 30 controls the lowering of the suction nozzles 17A and 17B. It means that the CPU 30 decreases the lowering amount when the printed board P is warped upward, and increases the lowering amount when the printed board P is warped downward.

As described above, the invention provides an electronic component mounting apparatus which achieves setting of measurement positions suitable for a warping state of a printed board and provides an easy work of setting the measurement positions.

Although an embodiment of the invention is described above, those skilled in the art would understand that various substitutions, changes or modifications are possible based on the above description and the invention includes the various substitutions, changes or modifications within the scope of the invention.

What is claimed is:

1. An electronic component mounting apparatus comprising:
    a component feeding device supplying an electronic component to a pickup position;
    a suction nozzle picking up the electronic component supplied to the pickup position and mounting the picked up electronic component on a printed board;
    a height level detection device measuring height levels of the printed board positioned in a mounting position;
    a monitor graphically displaying a warping state of a sample printed board positioned in the mounting position based on height level measurements by the height level detection device on predetermined positions of the sample printed board;
    a setting device setting measurement positions on the printed board for actual mounting operations using the monitor;
    a converting device converting the set measurement positions into coordinates on the printed board; and
    a memory storing the coordinates of the set measurement positions on the printed board.

2. The electronic component mounting apparatus of claim 1, further comprising a control device controlling a lowering of the suction nozzle during the actual mounting operations based on height level measurements of the printed board at the coordinates.

* * * * *